US011142484B2

(12) United States Patent
Mitsuya et al.

(10) Patent No.: US 11,142,484 B2
(45) Date of Patent: Oct. 12, 2021

(54) COMPONENT FOR SEMICONDUCTOR PRODUCTION DEVICE, AND PRODUCTION METHOD OF COMPONENT FOR SEMICONDUCTOR PRODUCTION DEVICE

(71) Applicant: NGK SPARK PLUG CO., LTD., Nagoya (JP)

(72) Inventors: Kohei Mitsuya, Inuyama (JP); Hideo Tange, Ichinomiya (JP); Motoki Hotta, Kasugai (JP); Takamichi Ogawa, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 123 days.

(21) Appl. No.: 16/318,323

(22) PCT Filed: Jul. 13, 2017

(86) PCT No.: PCT/JP2017/025611
§ 371 (c)(1),
(2) Date: Jan. 16, 2019

(87) PCT Pub. No.: WO2018/016420
PCT Pub. Date: Jan. 25, 2018

(65) Prior Publication Data

US 2019/0263724 A1 Aug. 29, 2019

(30) Foreign Application Priority Data

Jul. 20, 2016 (JP) ............................ JP2016-142494
Aug. 1, 2016 (JP) ............................ JP2016-151326
Oct. 20, 2016 (JP) ............................ JP2016-205640

(51) Int. Cl.
*C04B 35/10* (2006.01)
*C04B 37/00* (2006.01)
(Continued)

(52) U.S. Cl.
CPC ............ *C04B 37/001* (2013.01); *C04B 35/10* (2013.01); *C04B 37/00* (2013.01);
(Continued)

(58) Field of Classification Search
CPC .......... C04B 2237/343; C04B 2235/96; C04B 35/645; C04B 37/006; C04B 35/63424;
(Continued)

(56) References Cited

U.S. PATENT DOCUMENTS 6,261,708 B1 7/2001 Ohashi et al.
2003/0140463 A1* 7/2003 Chen ....................... F16L 33/04 24/274 R
2003/0150563 A1 8/2003 Kuibara et al.

FOREIGN PATENT DOCUMENTS

JP H10-242252 A 9/1998
JP 11278950 A * 10/1999
(Continued)

OTHER PUBLICATIONS

Japan Patent Office, International Search Report issued in international phase of subject application, PCT Application No. PCT/JP2017/025611, dated Sep. 12, 2017.
(Continued)

*Primary Examiner* — Daniel J. Schleis
*Assistant Examiner* — Kevin Ct Li
(74) *Attorney, Agent, or Firm* — Stites & Harbison, PLLC; Jeffrey A. Haeberlin; James R. Hayne

(57) ABSTRACT

A semiconductor production device component includes a first ceramic member including an AlN-based material, a second ceramic member including an AlN-based material, and a joint layer disposed between the first ceramic member and the second ceramic member so as to join the first ceramic member and the second ceramic member to each
(Continued)

other. The joint layer includes a composite oxide containing Gd and Al, and $Al_2O_3$, and is free from AlN.

5 Claims, 7 Drawing Sheets

(51) Int. Cl.
*H01L 21/687* (2006.01)
*H01L 21/67* (2006.01)

(52) U.S. Cl.
CPC .. *H01L 21/67103* (2013.01); *H01L 21/68714* (2013.01); *H01L 21/68757* (2013.01); *H01L 21/68792* (2013.01); *C04B 2237/343* (2013.01)

(58) Field of Classification Search
CPC .... C04B 2235/3224; C04B 2235/3217; C04B 2237/066; C04B 37/001; C04B 37/00; H01L 21/67103; H01L 21/68757; H01L 21/68792; H01L 21/02178; H01L 21/4807; H01L 21/683; H01L 2924/10323
See application file for complete search history.

(56) References Cited

FOREIGN PATENT DOCUMENTS

| | | | | | |
|---|---|---|---|---|---|
| JP | H11-278950 | A | | 10/1999 | |
| JP | 2004-345952 | A | | 12/2004 | |
| JP | 4032971 | B2 | | 1/2008 | |
| KR | 2014-0132903 | A | | 11/2014 | |
| KR | 20140132903 | A | * | 11/2014 | |
| WO | WO-2014053321 | A | * | 4/2014 | ......... C23C 28/3215 |

OTHER PUBLICATIONS

Korean Intellectual Property Office, Office Action (Notification of Reason for Refusal) issued in corresponding Application No. 10-2019-7001580, dated Aug. 1, 2020.

* cited by examiner

COMPONENT FOR SEMICONDUCTOR PRODUCTION DEVICE, AND PRODUCTION METHOD OF COMPONENT FOR SEMICONDUCTOR PRODUCTION DEVICE

TECHNICAL FIELD

The technique disclosed in the present specification relates to components for semiconductor production devices.

BACKGROUND ART

Susceptors (heating devices) are used as components in semiconductor production devices. For example, a susceptor includes a plate-shaped ceramic holding member having a built-in heater, a cylindrical ceramic supporting member disposed on one side of the holding member, and a joint layer disposed between the holding member and the supporting member so as to join one surface of the holding member and one surface of the supporting member to each other. The opposite surface of the holding member is a holding surface on which a wafer will be mounted. The susceptor heats a wafer mounted on the holding surface by means of heat generated by the application of a voltage to the heater. Some known susceptors of this class have a holding member and a supporting member which are each made of materials based on AlN (aluminum nitride) having relatively high thermal conductivity, and a joint layer which is made of materials including AlN (see, for example, Patent Literatures 1 and 2).

CITATION LIST

Patent Literature

PTL 1: Japanese Patent No. 4032971

PTL 2: Japanese Unexamined Patent Application Publication No. 2004-345952

SUMMARY OF INVENTION

Technical Problem

In the components for semiconductor production devices described above which have an AlN-containing joint layer, AlN-based holding member and supporting member are joined together via a joint agent including AlN powder at a preset joining temperature that is below a sintering temperature adopted for the sintering of the holding member and the supporting member. The reason for this is because if the joining process takes place at a chosen temperature equal to or higher than a sintering temperature for sintering of the holding member and the supporting member, the AlN-based holding member and supporting member are sometimes deformed.

If, however, the joining temperature is set to be below a sintering temperature adopted for the sintering of the holding member and the supporting member, the AlN powder in the joint agent is not sintered sufficiently and sometimes remains as aggregated particles. Such aggregates of AlN particles introduce hollows in the joint layer and thereby can cause a decrease in the bond strength between the holding member and the supporting member.

The above problem is encountered not only in the joining of a holding member and a supporting member into a susceptor, but also in the joining of ceramic members for constituting a holding device such as, for example, an electrostatic chuck. Further, the above problem exists not only in holding devices, but also in the joining of ceramic members for constituting semiconductor production device components such as, for example, shower heads.

The present specification discloses a technique capable of solving the problem discussed above.

Solution to Problem

The technique disclosed in the present specification may be realized, for example, in the forms described below.

(1) A semiconductor production device component disclosed in the present specification includes a first ceramic member including an AlN-based material, a second ceramic member including an AlN-based material, and a joint layer disposed between the first ceramic member and the second ceramic member so as to join the first ceramic member and the second ceramic member to each other, wherein the joint layer includes a composite oxide containing Gd and Al, and $Al_2O_3$, and is free from AlN. As a result of studies and experiments, the present inventors have found that a joint layer which includes a composite oxide containing Gd (gadolinium) and Al (aluminum) and $Al_2O_3$ (aluminum oxide, which may also be called as alumina) and is free from AlN (aluminum nitride) can join together ceramic members including an AlN-based material with a high bond strength even at a joining temperature below a sintering temperature which is adopted for the sintering of these ceramic members, as compared to a joint layer including AlN. By virtue of the joint layer being configured so that it includes a composite oxide containing Gd and Al, and $Al_2O_3$, and is free from AlN, this semiconductor production device component can attain a reduction in the loss of bond strength between the first ceramic member and the second ceramic member as compared to when AlN is added to the joint layer.

(2) In the above semiconductor production device component, the content of the composite oxide in the joint layer may be not less than 10 mol % and not more than 86 mol %. By configuring the semiconductor production device component as described above, the joining temperature can be further lowered while attaining a reduction in the loss of bond strength, as compared to when AlN is added to the joint layer.

(3) A method for producing a semiconductor production device component disclosed in the present specification includes a step of providing a first ceramic member including an AlN-based material, a step of providing a second ceramic member including an AlN-based material, and a step of joining the first ceramic member and the second ceramic member to each other by thermally pressing the first ceramic member and the second ceramic member to each other via a joint agent which includes $Gd_2O_3$ and $Al_2O_3$ and is free from AlN and which is disposed between the first ceramic member and the second ceramic member.

(4) A semiconductor production device component disclosed in the present specification includes a first ceramic member including an AlN-based material, a second ceramic member including an AlN-based material, and a plurality of joint sections disposed between the first ceramic member and the second ceramic member so as to join the first ceramic member and the second ceramic member to each other, wherein the joint sections include a composite oxide containing Gd and Al, and $Al_2O_3$, and are free from AlN. By virtue of the joint sections being configured so that they include a composite oxide containing Gd and Al, and $Al_2O_3$, and are free from AlN, this semiconductor production device component can attain a reduction in the loss of bond strength between the first ceramic member and the second ceramic member as compared to when AlN is added to the joint sections.

(5) In the above semiconductor production device component, the content of the composite oxide in the joint sections may be not less than 10 mol % and not more than 86 mol %. By configuring the semiconductor production device component as described above, the joining temperature can be further lowered while attaining a reduction in the loss of bond strength, as compared to when AlN is added to the joint sections.

The technique disclosed in the present specification may be implemented in various forms and may be embodied in the forms of semiconductor production device components, for example, holding devices such as electrostatic chucks and vacuum chucks, heating devices such as susceptors, and shower heads.

DESCRIPTION OF EMBODIMENTS

A. Embodiment

A-1. Configuration of Susceptor 100

Figure 1:
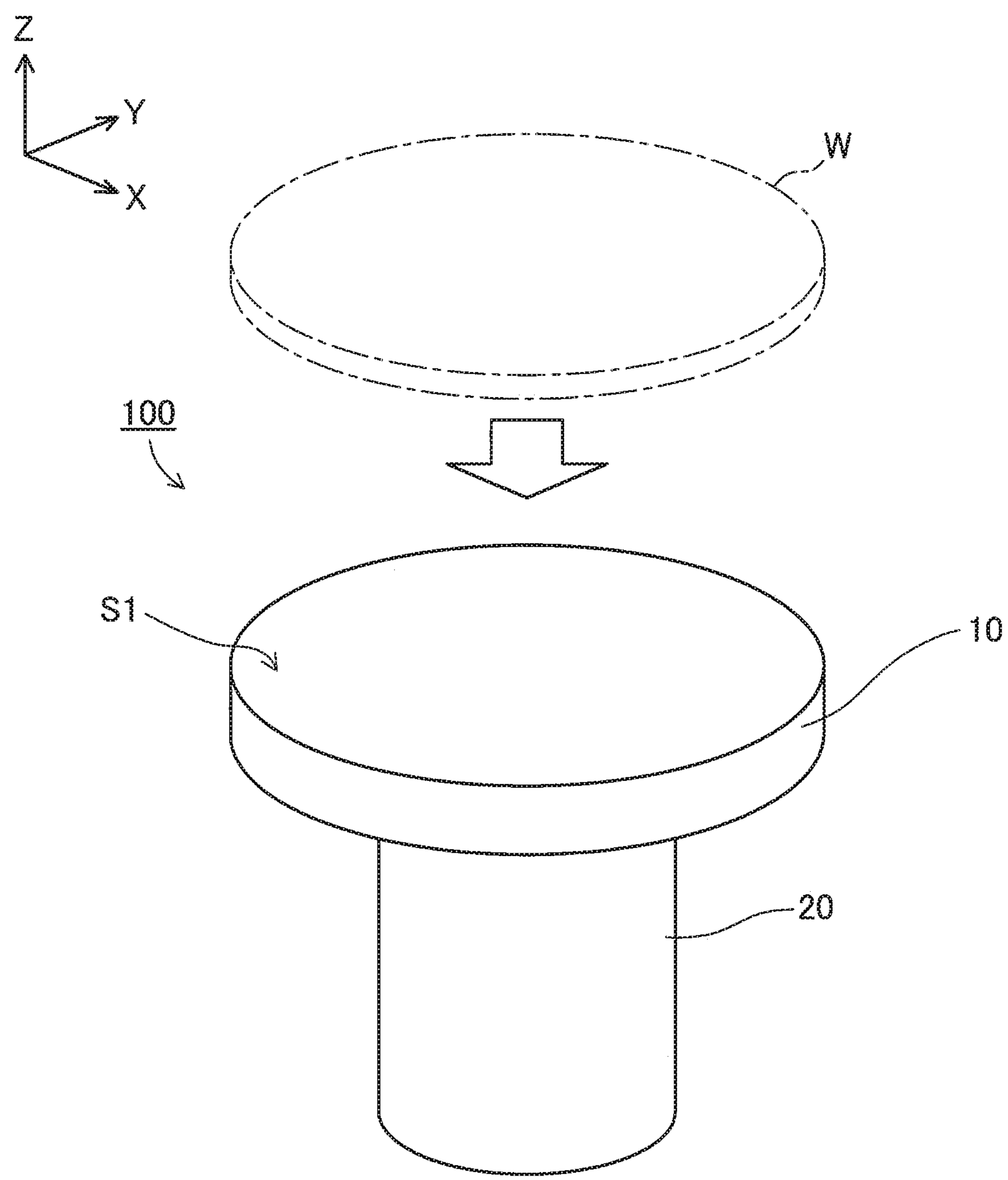
FIG. 1 is a perspective view schematically illustrating an appearance configuration of a susceptor 100 according to an embodiment.
Figure 2:
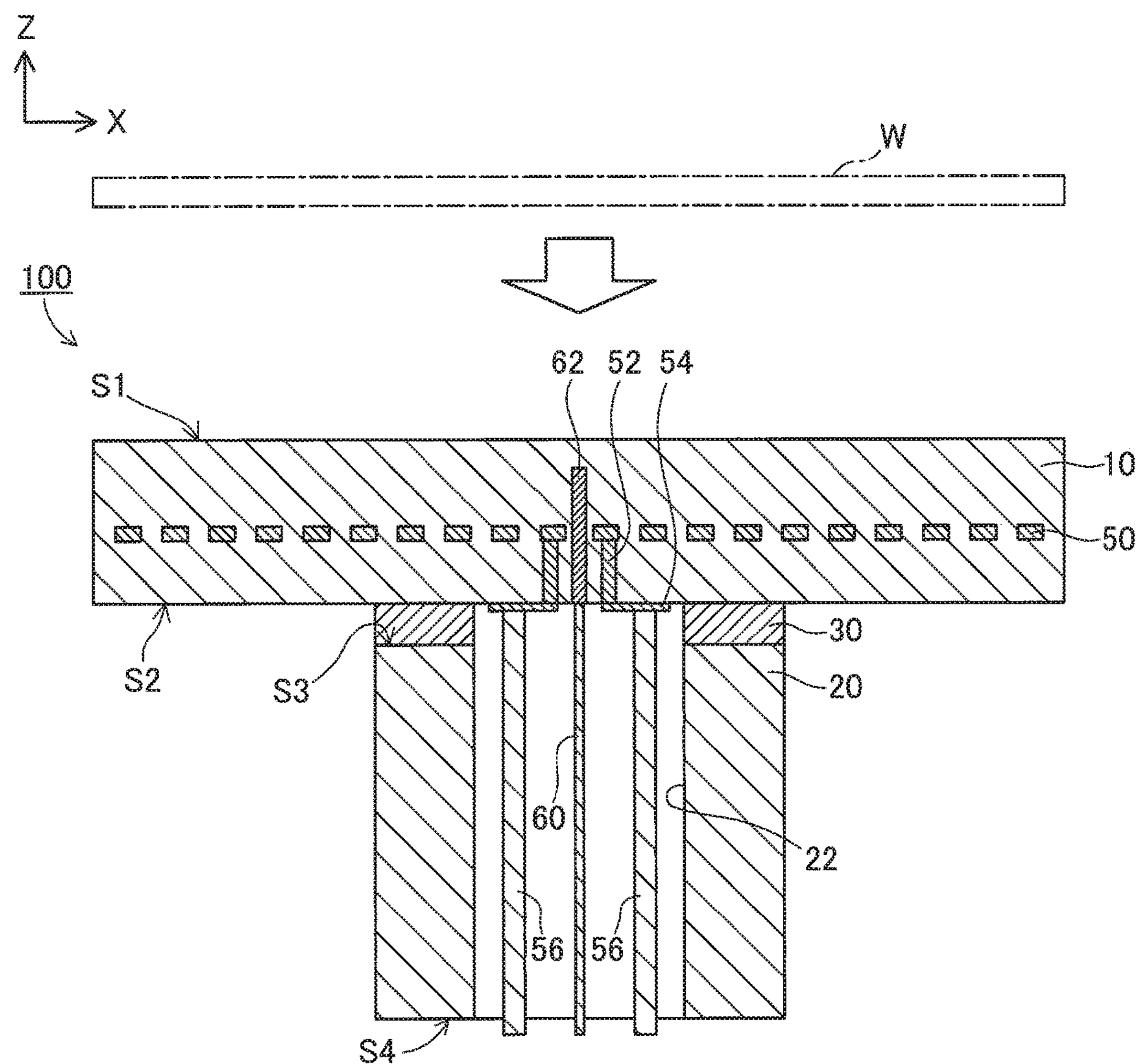
FIG. 2 is a view schematically illustrating an XZ sectional configuration of a susceptor 100 according to an embodiment.

FIG. 1 is a perspective view schematically illustrating an appearance configuration of a susceptor 100 according to the present embodiment. FIG. 2 is a view schematically illustrating an XZ sectional configuration of the susceptor 100 according to the present embodiment. In these figures, X, Y and Z axes perpendicular to one another are shown to indicate directions. In the present specification, for the sake of convenience, the positive direction on the Z axis is defined as the upward direction, and the negative direction on the Z axis as the downward direction. However, the susceptor 100 may be actually arranged in a direction which does not conform to such definitions. The susceptor 100 corresponds to the semiconductor production device component in the claims.

The susceptor 100 is a device which holds a workpiece (for example, a wafer W) and heats the workpiece to a predetermined processing temperature, and is installed in, for example, a thin-film forming device (for example, a CVD device or a sputtering device) or an etching device (for example, a plasma etching device) used in the manufacturing of semiconductor devices. The susceptor 100 includes a holding member 10 and a supporting member 20 which are arranged adjacent to each other in a predetermined arrangement direction (in the present embodiment, in the vertical (Z axis) direction). The holding member 10 and the supporting member 20 are arranged so that the lower surface of the holding member 10 (hereinafter, written as the "holder-side joint surface S2") and the upper surface of the supporting member 20 (hereinafter, written as the "support-side joint surface S3") are opposed to each other in the arrangement direction. The susceptor 100 further includes a joint layer 30 disposed between the holder-side joint surface S2 of the holding member 10 and the support-side joint surface S3 of the supporting member 20. The holding member 10 corresponds to the first ceramic member in the claims, and the supporting member 20 to the second ceramic member in the claims.

(Holding Member 10)

For example, the holding member 10 is a plate-shaped member having a flat circular surface, and is made of a ceramic based on AlN (aluminum nitride). Here, the term "based" means that the component has the largest proportion (weight proportion). For example, the diameter of the holding member 10 is about 100 mm to 500 mm. For example, the thickness of the holding member 10 is about 3 mm to 15 mm.

Within the holding member 10, a heater 50 is disposed which is composed of a linear resistive heating element formed of a conductive material (such as, for example, tungsten or molybdenum). A pair of ends of the heater 50 are arranged near the central portion of the holding member 10. Further, a pair of vias 52 are disposed within the holding member 10. Each via 52 is a linear conductor extending in the vertical direction. The upper ends of the vias 52 are connected to the respective ends of the heater 50, and the lower ends of the vias 52 are disposed on the holder-side joint surface S2 of the holding member 10. Further, a pair of receiving electrodes 54 are disposed near the central portion of the holder-side joint surface S2 of the holding member 10. The receiving electrodes 54 are connected to the respective lower ends of the vias 52 so as to establish an electrical connection between the heater 50 and the receiving electrodes 54.

(Supporting Member 20)

For example, the supporting member 20 is a cylindrical member extending in the vertical direction, and has a through hole 22 extending in the vertical direction from the support-side joint surface S3 (the upper surface) to the lower surface S4. Similarly to the holding member 10, the supporting member 20 is made of a ceramic based on AlN. The supporting member 20 has an outer diameter of, for example, about 30 mm to 90 mm, an inner diameter of, for example, about 10 mm to 60 mm, and a vertical length of, for example, about 100 mm to 300 mm. The through hole 22 of the supporting member 20 accommodates a pair of electrode terminals 56. Each electrode terminal 56 is a rod-shaped conductor extending in the vertical direction. The upper ends of the electrode terminals 56 are brazed to the respective receiving electrodes 54. When a voltage is applied from a power source (not shown) to the pair of electrode terminals 56, the heater 50 is caused to generate heat, which heats the holding member 10 and then heats the wafer W held on the upper surface (hereinafter, written as the "holding surface S1") of the holding member 10. For example, the heater 50 is arranged substantially concentrically as viewed in the Z direction so as to be capable of heating the holding surface S1 of the holding member 10 as uniformly as possible. Further, the through hole 22 of the supporting member 20 accommodates two metal wires 60 as a thermocouple (only one metal wire is illustrated in FIG. 2).

Each metal wire 60 extends in the vertical direction, and an upper end portion 62 of each metal wire 60 is buried in the central portion of the holding member 10. This structure allows the temperature inside the holding member 10 to be measured, and the temperature of the wafer W to be controlled based on the measurement result.

(Joint Layer 30)

The joint layer 30 is a sheet layer shaped like a circular ring, and joins together the holder-side joint surface S2 of the holding member 10 and the support-side joint surface S3 of the supporting member 20. The joint layer 30 is formed of materials which include $GdAlO_3$ and $Al_2O_3$ (alumina) and are free from AlN. The joint layer 30 has an outer diameter of, for example, about 30 mm to 90 mm, an inner diameter of, for example, about 10 mm to 60 mm, and a thickness of, for example, about 1 μm to 100 μm.

A-2. Method for Producing Susceptor 100

Figure 3:
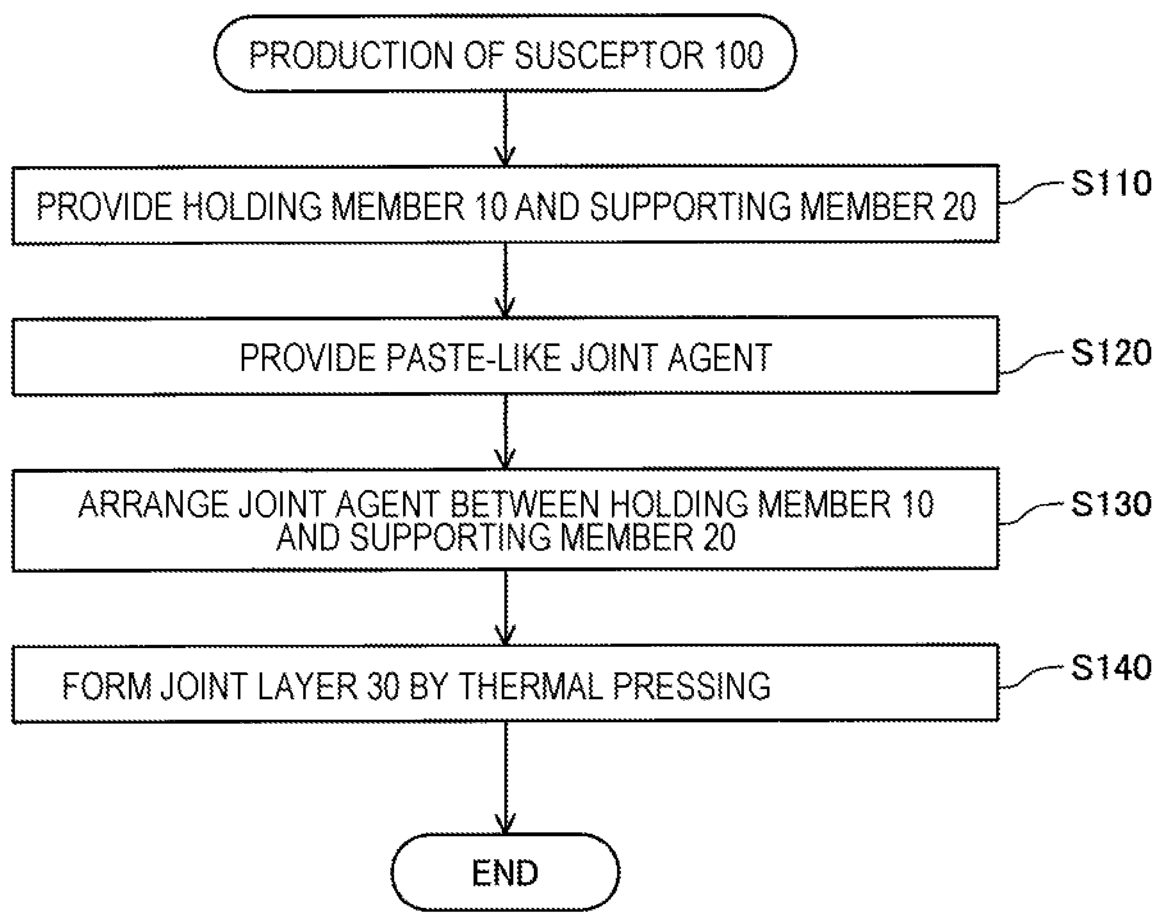
FIG. 3 is a flow chart illustrating a method for producing a susceptor 100 according to an embodiment.

Next, a method for producing a susceptor 100 of the present embodiment will be described. FIG. 3 is a flow chart illustrating a method for producing a susceptor 100 according to the present embodiment. First, a holding member 10 and a supporting member 20 are provided (S110). As mentioned earlier, the holding member 10 and the supporting member 20 are both made of a ceramic based on AlN. The holding member 10 and the supporting member 20 are producible by known methods, and thus the description of the methods for their production will be omitted.

Next, a paste-like joint agent for forming a joint layer 30 is provided (S120). Specifically, $Gd_2O_3$ (gadolinia) powder and $Al_2O_3$ powder are mixed together in a predetermined ratio and are further mixed with an acrylic binder and butylcarbitol to give a paste-like joint agent. The composition ratio of the materials forming the paste-like joint agent is preferably, for example, 24 mol % $Gd_2O_3$ and 76 mol % $Al_2O_3$. Next, the paste-like joint agent that has been provided is arranged between the holding member 10 and the supporting member 20 (S130). Specifically, the holder-side joint surface S2 of the holding member 10 and the support-side joint surface S3 of the supporting member 20 are lapped so that the joint surfaces S2 and S3 have a surface roughness of not more than 1 μm and a flatness of not more than 10 μm. Next, the paste-like joint agent is printed, through a mask, onto at least one of the holder-side joint surface S2 of the holding member 10 and the support-side joint surface S3 of the supporting member 20. Thereafter, the support-side joint surface S3 of the supporting member 20 and the holder-side joint surface S2 of the holding member 10 are superimposed one on top of the other via the paste-like joint agent, thereby forming a stack of the holding member 10 and the supporting member 20.

Next, the stack of the holding member 10 and the supporting member 20 is placed into a hot press furnace, and is heated under pressure (S140). Consequently, the paste-like joint agent is melted to form a joint layer 30, and the holding member 10 and the supporting member 20 are joined together by the joint layer 30. The pressure during this thermal pressure bonding is preferably set in the range of not less than 0.1 MPa and not more than 15 MPa. Controlling the pressure during the thermal pressure bonding at 0.1 MPa or above ensures that the members will be joined together without gaps therebetween even in the presence of irregularities such as waves on the surface of the members that are to be joined (the holding member 10 and the supporting member 20), thus making it possible to prevent an early decrease in the bond strength. By controlling the pressure during the thermal pressure bonding at 15 MPa or below, the holding member 10 can be prevented from cracking and the supporting member 20 from being deformed. Incidentally, the joint surfaces S2 and S3 are subjected to a pressure of 0.2 $kgf/cm^2$ to 3 $kgf/cm^2$.

During the thermal pressure bonding, the temperature is preferably raised to 1750° C. When the temperature is raised to 1750° C. during the thermal pressure bonding, the temperature is kept at 1750° C. for about 10 minutes and thereafter the temperature inside the hot press furnace is lowered to room temperature. After the thermal pressure bonding, post treatments (such as polishing of the circumferences and the upper and lower surfaces, and the formation of terminals) are performed as required. A susceptor 100 having the aforementioned configuration is produced by the production method described above.

Figure 4:
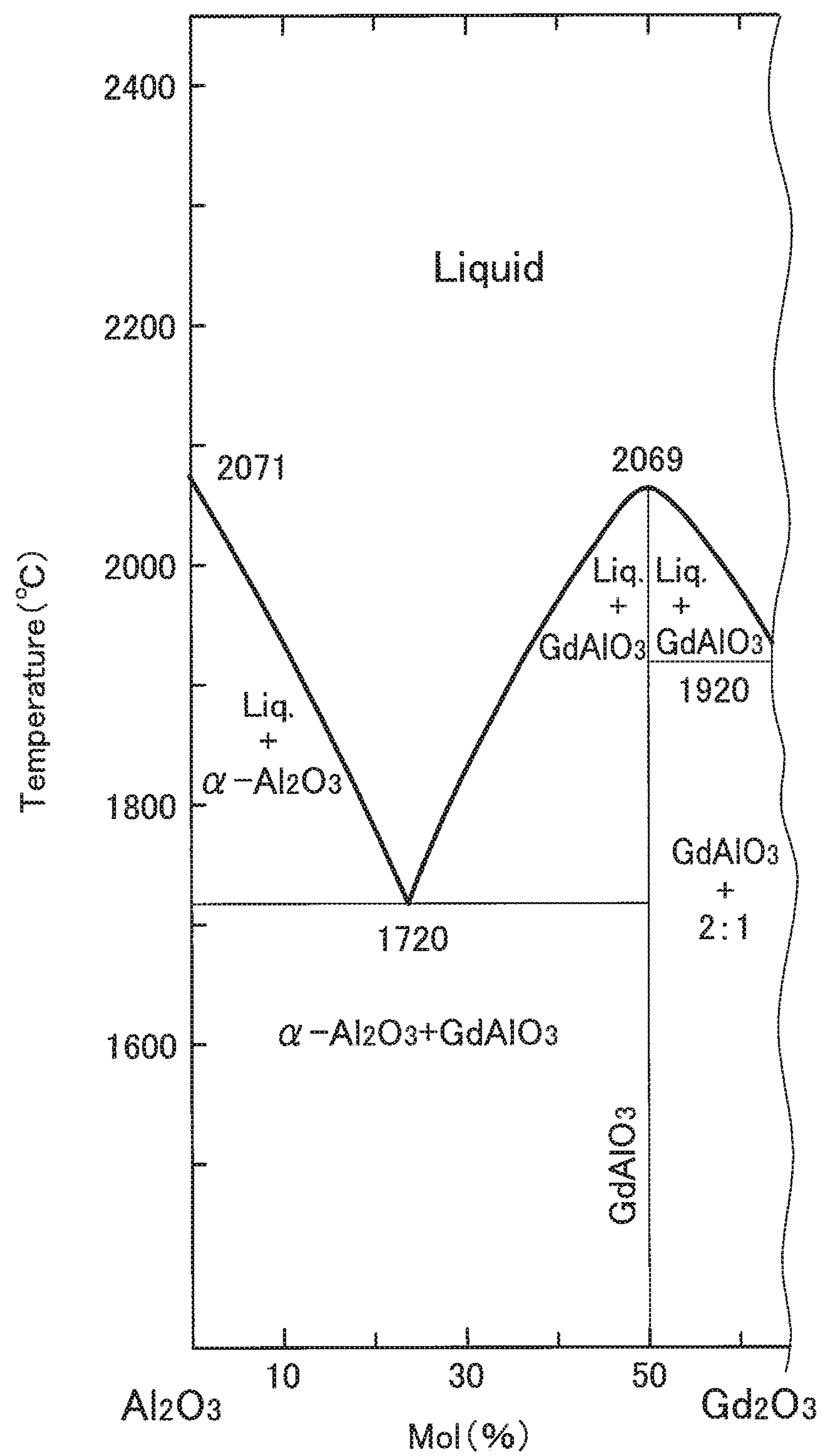
FIG. 4 is a diagram showing phase changes in $Al_2O_3$ and $Gd_2O_3$ with temperatures.

Next, the content of $Gd_2O_3$ in the joint agent will be described. The content of $Gd_2O_3$ in the joint agent is preferably not less than 5 mol % and not more than 43 mol %. FIG. 4 is a diagram showing phase changes in $Al_2O_3$ and $Gd_2O_3$ with temperatures. From FIG. 4, it is understood that the joint agent can form the joint layer 30 at a relatively low joining temperature (a temperature close to 1720° C.) when the content of $Gd_2O_3$ in the joint agent is not less than 5 mol % and not more than 43 mol %. Here, when the content of $Gd_2O_3$ in the joint agent is not less than 5 mol % and not more than 43 mol %, the content of $GdAlO_3$ in the joint layer 30 is not less than 10 mol % and not more than 86 mol %. That is, when the content of $GdAlO_3$ in the joint layer 30 is not less than 10 mol % and not more than 86 mol %, the joining can be accomplished at a lower temperature while attaining a reduction in the loss of the bond strength between the holding member 10 and the supporting member 20 (the bond strength of the joint layer 30), as compared to when a joint agent including AlN is used.

A-3. Performance Evaluation

Susceptor 100 of EXAMPLE and susceptor of COMPARATIVE EXAMPLE were tested as described below to evaluate their performance.

A-3-1. Example and Comparative Example

The susceptor 100 of EXAMPLE is one produced by the production method described hereinabove. The susceptor of COMPARATIVE EXAMPLE includes a holding member, a supporting member and a joint layer. The susceptor 100 of EXAMPLE and the susceptor of COMPARATIVE EXAMPLE are common in the following.

(Configuration of Holding Member)

Material: AlN-based ceramic

Diameter: 100 mm to 500 mm

Thickness: 3 mm to 15 mm (Configuration of Supporting Member)

Material: AlN-based ceramic

Outer diameter: 30 mm to 90 mm

Inner diameter: 10 mm to 60 mm

Vertical length: 100 mm to 300 mm (Profile of Joint Layer)

Outer diameter: 30 mm to 90 mm

Inner diameter: 10 mm to 60 mm

Thickness: 1 μm to 100 μm

The susceptor 100 of EXAMPLE and the susceptor of COMPARATIVE EXAMPLE differ in the following.

(Materials of Joint Layer)

The materials of the joint layer 30 in the susceptor 100 of EXAMPLE included $GdAlO_3$ and $Al_2O_3$, and were free from AlN.

The materials of the joint layer in the susceptor of COMPARATIVE EXAMPLE included AlN.

The susceptor of COMPARATIVE EXAMPLE was produced basically in the same manner as the susceptor 100 of EXAMPLE produced by the aforementioned method, except that AlN powder was mixed together with the $Gd_2O_3$ powder and the $Al_2O_3$ powder and further with an acrylic binder and butylcarbitol to give a paste-like joint agent containing 5 wt % AlN powder based on the total of the $Gd_2O_3$ powder, the AlN powder and the $Al_2O_3$ powder taken as 100 wt %.

A-3-2. Evaluation Procedures

To evaluate the bond strength of the joint layer, the susceptor 100 of EXAMPLE and the susceptor of COMPARATIVE EXAMPLE were subjected to a three-point bending test.

(Three-Point Bending Test)

In the three-point bending test, a test piece with a predetermined size was cut from, for example, the joint of the susceptor 100 of EXAMPLE so that it included the holding member 10, the supporting member 20 and the joint layer 30. The test piece was set in a three-point bending tester having a pair of supporting pins and an indenter. Specifically, the test piece that had been cut out was set so that a portion of the holding member 10 and a portion of the supporting member 20 were placed on the respective supporting pins, and the indenter was lowered from above the joint layer 30 and was brought into contact with a portion thereof. Next, the pressing force of the indenter exerted on the joint layer 30 was increased gradually to apply a greater load on the portion of the joint layer 30. The breaking load at which the joint layer 30 was broken was measured. The bond strength of the joint layer 30 was evaluated based on the ratio of the breaking load of the test piece relative to the reference load which was the breaking load of a base material entirely formed of an AlN-based ceramic.

A-3-3. Evaluation Results (Three-Point Bending Test)

In the three-point bending test of the susceptor 100 of EXAMPLE, the bond strength of the joint layer 30 was approximately 90% of the reference load. In contrast, the joint layer in the susceptor of COMPARATIVE EXAMPLE had a bond strength which was approximately 40% of the reference load, and compared unfavorably to the joint layer 30 in the susceptor 100 of EXAMPLE.

A-4. Effects of Present Embodiment

Figure 5:
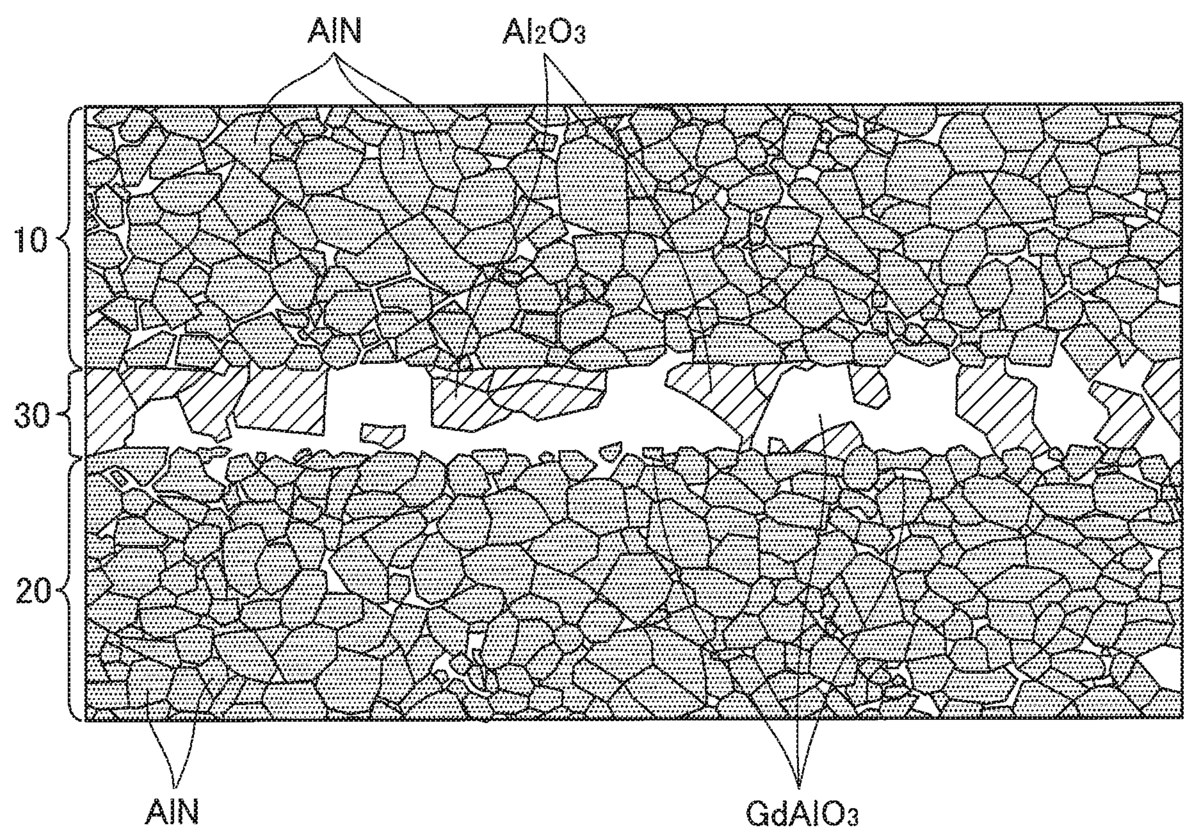
FIG. 5 is a view schematically illustrating a SEM image of a test piece of susceptor 100 of EXAMPLE.

As discussed above, the joint layer 30 which includes $GdAlO_3$ and $Al_2O_3$ and is free from AlN can join together ceramic members (the holding member 10 and the supporting member 20) made of an AlN-based material with a high bond strength even at a joining temperature below a sintering temperature adopted for the sintering of these ceramic members, as compared to a joint layer including AlN. FIG. 5 is a view schematically illustrating a SEM image of a test piece of susceptor 100 of EXAMPLE observed on SEM (scanning electron microscope). As illustrated in FIG. 5, the materials forming the joint layer 30, in particular, $GdAlO_3$ was distributed so as to bury gaps between AlN particles forming the holding member 10 and the supporting member 20, by virtue of its high fluidity even at low temperatures. From this SEM image too, it can be seen that the joint layer 30 joins the holding member 10 and the supporting member 20 with a high bond strength. Because the joining temperature is below the temperature for sintering of the members such as the holding member 10, the holding member 10 and the supporting member 20 which are based on AlN can be prevented from deformation.

Figure 6:
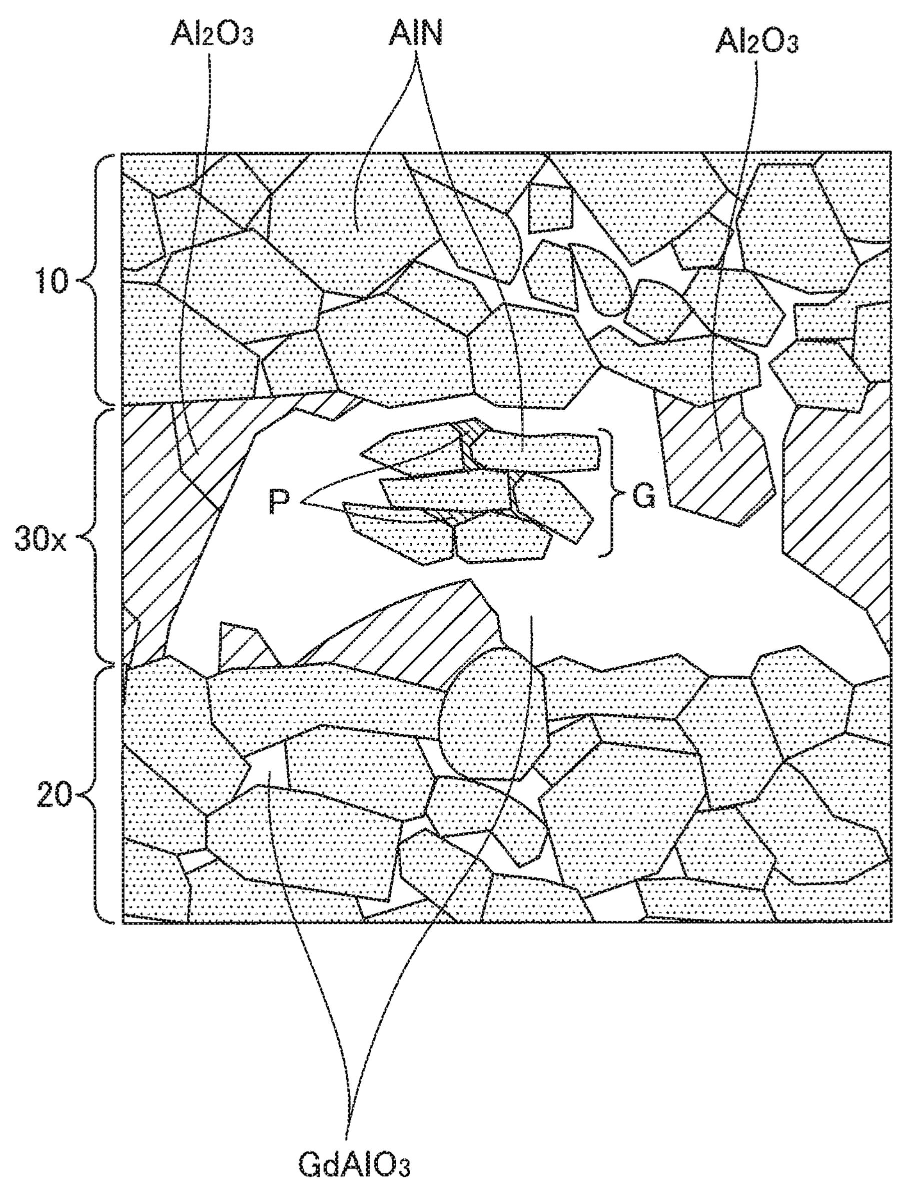
FIG. 6 is a view schematically illustrating a SEM image of a test piece of susceptor of COMPARATIVE EXAMPLE.

In the present specification, the phrase "free from AlN" means that the joint layer does not contain an aggregate of a plurality of AlN particles which has a void enclosed by a plurality of AlN particles adjacent to one another. FIG. 6 is a view schematically illustrating a SEM image of a test piece of the susceptor of COMPARATIVE EXAMPLE. Unlike the embodiment described hereinabove, the susceptor of COMPARATIVE EXAMPLE is such that the holding member 10 and the supporting member 20 are joined together via a joint layer 30*x* formed of materials including AlN. As illustrated in the figure, the joint layer 30*x* designed to contain AlN often has an aggregate G of a plurality of AlN particles. This aggregate G has voids P enclosed by a plurality of AlN particles which constitute the aggregate G and are adjacent to one another. Even the joint layer 30 of the above embodiment which is formed from AlN-free materials sometimes contains AlN particles precipitated during, for example, steps of production of the semiconductor production device component, the precipitates stemming from the AlN-based holding member 10 and supporting member 20. Although such a joint layer 30 designed to be free from the addition of AlN can contain precipitated AlN particles arising from the components in the holding member 10 and the supporting member 20, these AlN particles do not form aggregates G and are individually dispersed in the joint layer 30. Thus, the phrase "free from AlN" in the present specification means that the joint layer (the joint sections) does not contain an aggregate of a plurality of AlN particles which has a void enclosed by a plurality of AlN particles adjacent to one another. In a sectional view of the susceptor, part of the joint layer (the joint sections) is sometimes embedded in a collection of free AlN particles in a sectional view near a boundary between the joint layer (the joint sections) and the ceramic member; this phenomenon does not apply to the aggregate having voids.

B. Modified Example

The technique disclosed in the present specification is not limited to the embodiment illustrated above, and various modifications are possible without departing from the spirit thereof. For example, the following modifications are possible.

Figure 7:
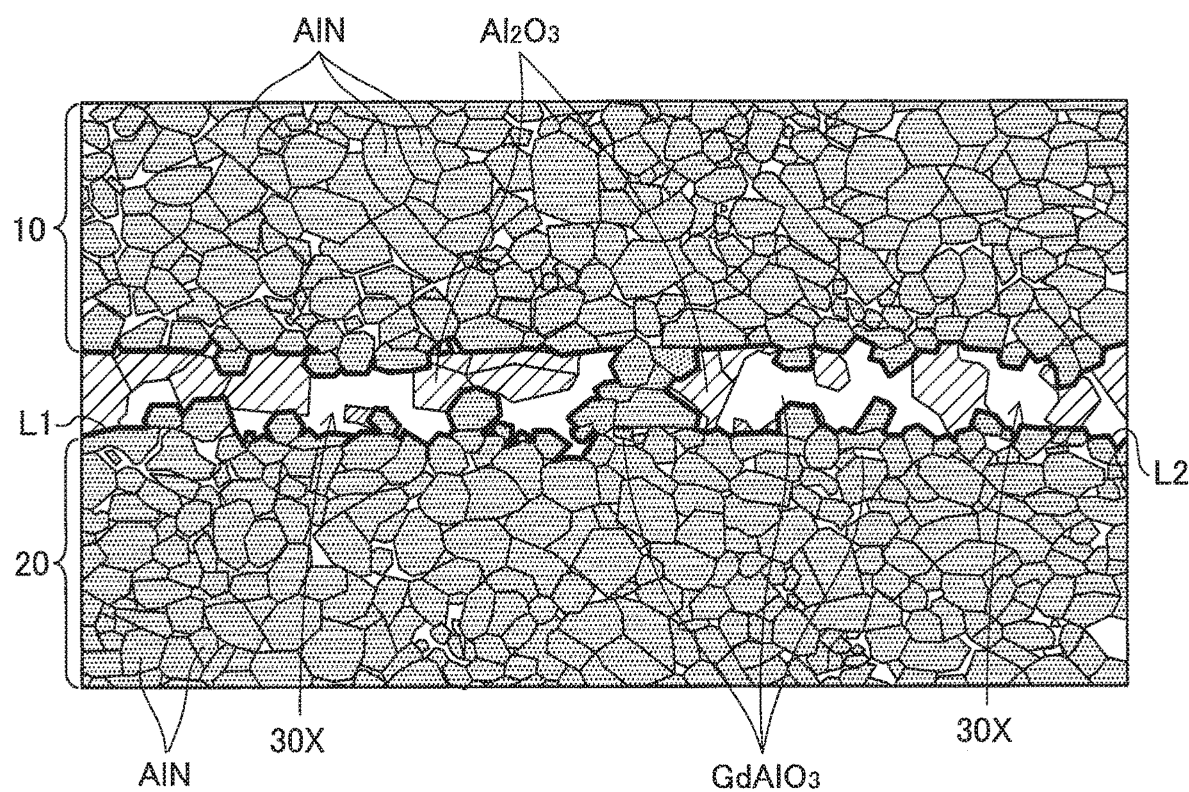
FIG. 7 is a view schematically illustrating a SEM image of a test piece of susceptor of MODIFIED EXAMPLE.

FIG. 7 is a view schematically illustrating a SEM image of a test piece of susceptor of MODIFIED EXAMPLE. The susceptor of MODIFIED EXAMPLE differs from the susceptor 100 according to the above embodiment in that the holding member 10 and the supporting member 20 are joined together not via the joint layer 30 but via a plurality of joint sections 30X. In other words, the susceptor of MODIFIED EXAMPLE has a plurality of joint sections 30X individually dispersed between the holding member 10 and the supporting member 20. Specifically, as illustrated in FIG. 7, the holding member 10 and the supporting member 20 are partly connected via AlN particles which are a material forming the holding member 10 and the supporting member 20.

Here, in the present specification, boundaries between the joint section (the joint layer), and the holding member 10 and supporting member 20 are defined by an outline along the surface of a group of continuous AlN particles which is formed by linking of AlN particles constituting the holding member 10 and the supporting member 20. That is, the region enclosed by the outline can be regarded as the joint section (the joint layer). FIG. 7 shows a joint section 30X enclosed by an outline L1, and a joint section 30X enclosed by an outline L2. Each of the joint sections includes $GdAlO_3$ and $Al_2O_3$, and is free from AlN. Even this susceptor of MODIFIED EXAMPLE can attain a reduction in the loss of bond strength between the holding member 10 and the supporting member 20, similarly to the embodiment described above. In the susceptor of MODIFIED EXAMPLE, each joint section 30X may have a $GdAlO_3$ content of not less than 10 mol % and not more than 86 mol %, in which case the joining temperature can be further lowered while attaining a reduction in the loss of bond strength, as compared to when AlN is added to the joint sections.

The ceramics forming the holding member 10 and the supporting member 20 in the embodiment and the modified example described above are based on AlN (aluminum nitride) and may contain other minor elements.

In the embodiment and the modified example described above, the materials forming the joint layer 30 (the joint sections 30X) may include a composite oxide which contains Al and Gd, other than $GdAlO_3$. The joint layer 30 (the joint sections 30X) may include substances except AlN as long as it includes a composite oxide containing Al and Gd, and $Al_2O_3$. For example, the joint layer 30 in the aforementioned embodiment sometimes includes a composite oxide containing Y and Al which involves Y (yttrium) diffused from the ceramic members such as the holding member 10 and the supporting member 20.

In the embodiment and the modified example described above, for example, a second joint layer (second joint sections) having a different composition from the joint layer 30 (the joint sections 30X) may be arranged together with the joint layer 30 (the joint sections 30X) between the holding member 10 and the supporting member 20. That is, the holding member 10 and the supporting member 20 may be joined together via a plurality of joint layers or a plurality of types of joint sections having different compositions.

The method for producing the susceptor 100 described in the aforementioned embodiment is only illustrative, and various modifications are possible.

The present invention is applicable not only to the susceptors 100, but also to other semiconductor production device components, for example, other types of heating devices such as polyimide heaters, holding devices (for example, electrostatic chucks and vacuum chucks) which have a ceramic plate and a base plate and are configured to hold a workpiece on the surface of the ceramic plate, and shower heads.

REFERENCE SIGNS LIST

10: HOLDING MEMBER 20: SUPPORTING MEMBER 22: THROUGH HOLE 30: JOINT LAYER 30X: JOINT SECTION 50: HEATER 52: VIA 54: RECEIVING ELECTRODE 56: ELECTRODE TERMINAL 60: METAL WIRE 62: UPPER END PORTION 100: SUSCEPTOR G: AGGREGATE L1, L2: OUTLINE P: VOID S1: HOLDING SURFACE S2: HOLDER-SIDE JOINT SURFACE S3: SUPPORT-SIDE JOINT SURFACE S4: LOWER SURFACE W: WAFER

The invention claimed is:

1. A semiconductor production device component comprising:

a first ceramic member including an AlN-based material in which AlN is the largest component by weight proportion, a second ceramic member including an AlN-based material in which AlN is the largest component by weight proportion, and a joint layer disposed between the first ceramic member and the second ceramic member so as to join the first ceramic member and the second ceramic member to each other, wherein the joint layer is composed of a composite oxide containing Gd and Al, and $Al_2O_3$.

2. The semiconductor production device component according to claim 1, wherein the content of the composite oxide in the joint layer is not less than 10 mol % and not more than 86 mol %.

3. A method for producing a semiconductor production device component, comprising:

a step of providing a first ceramic member including an AlN-based material in which AlN is the largest component by weight proportion, a step of providing a second ceramic member including an AlN-based material in which AlN is the largest component by weight proportion, and a step of joining the first ceramic member and the second ceramic member to each other by thermally pressing the first ceramic member and the second ceramic member to each other via a joint agent which is composed of $Gd_2O_3$ and $Al_2O_3$ and which is disposed between the first ceramic member and the second ceramic member.

4. A semiconductor production device component comprising:

a first ceramic member including an AlN-based material in which AlN is the largest component by weight proportion, a second ceramic member including an AlN-based material in which AlN is the largest component by weight proportion, and a plurality of joint sections disposed between the first ceramic member and the second ceramic member so as to join the first ceramic member and the second ceramic member to each other, wherein the joint sections are composed of a composite oxide containing Gd and Al, and $Al_2O_3$.

5. The semiconductor production device component according to claim 4, wherein the content of the composite oxide in the joint sections is not less than 10 mol % and not more than 86 mol %.

* * * * *